United States Patent
Sun et al.

(10) Patent No.: US 8,319,562 B2
(45) Date of Patent: Nov. 27, 2012

(54) SYSTEM AND METHOD FOR AMPLIFYING A SIGNAL USING MULTIPLE AMPLIFICATION STAGES SHARING A COMMON BIAS CURRENT

(75) Inventors: Bo Sun, San Diego, CA (US); Anthony F. Segoria, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 445 days.

(21) Appl. No.: 12/558,110

(22) Filed: Sep. 11, 2009

(65) Prior Publication Data

US 2011/0050340 A1  Mar. 3, 2011

Related U.S. Application Data (60) Provisional application No. 61/237,047, filed on Aug. 26, 2009.

(51) Int. Cl.
*H03F 3/04* (2006.01)
(52) U.S. Cl. ........ 330/311; 330/253; 330/261; 330/302; 330/306
(58) Field of Classification Search .................. 330/311, 330/261, 302, 306, 253
See application file for complete search history.

(56) References Cited

U.S. PATENT DOCUMENTS

| | | | | |
|---|---|---|---|---|
| 3,999,139 | A * | 12/1976 | Fennell | 330/288 |
| 7,786,806 | B2 * | 8/2010 | Duperray | 330/311 |
| 7,902,920 | B1 * | 3/2011 | Beffa | 330/86 |
| 7,917,117 | B2 * | 3/2011 | Zafonte et al. | 455/290 |
| 8,018,288 | B2 * | 9/2011 | Duster et al. | 330/311 |
| 8,019,306 | B2 * | 9/2011 | Iida | 455/280 |
| 2003/0107441 | A1 | 6/2003 | Grasset et al. | |
| 2008/0218265 | A1 | 9/2008 | Murden et al. | |

FOREIGN PATENT DOCUMENTS

| | | |
|---|---|---|
| EP | 0942526 A1 | 9/1999 |
| WO | WO2006027755 A1 | 3/2006 |
| WO | WO2006032932 A1 | 3/2006 |

OTHER PUBLICATIONS

He X et al,. "A 2.5-GHz Low-Power, High Dynamic Range, Self-Tuned<tex>$Q$</tex>-Enhanced LC Filter in SOI", IEEE Journal of Solid-State Circuits, IEEE Service Center, Piscataway, NJ, USA, vol. 40, No. 8, Aug. 1, 2005, pp. 1618-1628, XP011136746, ISSN: 0018-9200, DOI:10.1109/JSSC.2005.852043.

(Continued)

*Primary Examiner* — Patricia Nguyen
(74) *Attorney, Agent, or Firm* — Dang M. Vo; Paul S. Holdaway (57) ABSTRACT

An apparatus including cascaded amplification stages adapted to be biased by a common DC current to generate an amplified output signal from an input signal. A first amplification stage includes a routing network to substantially double an input voltage signal, and a first transconductance gain stage to generate a first current signal from the input voltage signal. A second amplification stage includes a resonator to convert the first current signal into a second voltage signal, and a second transconductance gain stage to generate a second current signal from the first current signal. A third amplification stage includes a current gain stage to generate a third current signal from the second current signal, and a load through which the third current signal flows to generate the output signal.

28 Claims, 9 Drawing Sheets

OTHER PUBLICATIONS

International Search Report and Written Opinion—PCT/US2010/046827, ISA/EPO—May 10, 2011.

Luff G F et al,. "A compact triple-band Eureka-147 RF tuner with an FM receiver", Solid-State Circuits Conference, 2005, Digest of Technical Papers. ISS CC. 2005 IEEE International San Francisco, CA, USA Feb. 6-10, 2005, IEEE, Piscataway, NJ, USA, Jan. 1, 2005, pp. 434-608, vol. 1, XP031173832, DOI:10.1109/ISSCC.2005.1494055 ISBN: 978-0-7803-8904-5.

Zencir E et al,. "A low-power UHF RF frontend for a low-IF receiver", ASIC/SOC Conference, 2002, 15th Annual IEEE International Sep. 25-28, 2002, Piscataway, NJ, USA, IEEE, Sep. 25, 2002, pp. 331-335, XP010622050, ISBN: 978-0-7803-7494-2.

\* cited by examiner

SYSTEM AND METHOD FOR AMPLIFYING A SIGNAL USING MULTIPLE AMPLIFICATION STAGES SHARING A COMMON BIAS CURRENT

CROSS-REFERENCE TO A RELATED APPLICATION

This application claims the benefit of the filing date of U.S. Provisional Patent Application Ser. No. 61/237,047, filed on Aug. 26, 2009, and entitled "System and Method for Amplifying a Signal Using Multiple Amplification Stages Sharing a Common Bias Current," which is incorporated herein by reference.

FIELD

The present disclosure relates generally to communication systems, and more specifically, to a system and method for amplifying a signal using multiple amplification stages sharing a common bias current.

BACKGROUND

In communication systems, signal amplifiers are employed to boosts the amplitude or power of signals to facilitate the reception and transmission of signals. For example, a communication device may employ a low noise amplifier (LNA) in a receiver in order to boost the strength of a weak signal received from a remote communication device to a sufficient level for processing and data recovery. As another example, a communication device may employ a power amplifier (PA) in a transmitter to boosts the strength of a signal for successful transmission to a remote communication device.

Many of these communication devices are portable devices, such as cellular telephones, personal digital assistants (PDAs), handheld devices, and other portable communication devices. These portable communication devices typically rely on a limited power source, such as a battery, to perform the various intended operations. A limited power source typically has a continuous use lifetime that depends on the amount of power used by the portable device. It is generally desired to extend the continuous use lifetime as much as possible. Accordingly, portable communication devices are more frequently designed to consume less and less power.

Accordingly, an amplifier that consumes less power and/or is more efficient in amplifying a signal is desirable for such communication devices.

SUMMARY

An aspect of the disclosure relates to an apparatus comprising a plurality of amplification stages configured to be biased by a common bias current to amplify an input signal so as to generate an output signal. In another aspect, one of the amplification stages comprises a first amplification stage adapted to apply a first transconductance gain to a first voltage signal related to the input signal to generate a first current signal. In yet another aspect, the first amplification stage comprises a routing network adapted to substantially double the first voltage signal. In still another aspect, the first amplification stage is configured as a common gate amplification stage.

In another aspect of the disclosure, one of the amplification stages comprises a second amplification stage adapted to convert the first current signal into a second voltage signal, and apply a second transconductance gain to the second voltage signal to generate a second current signal. In yet another aspect, the second amplification stage comprises a resonator adapted to convert the first current signal into the second voltage signal. In still another aspect, the second amplification stage is configured as a common source amplification stage.

In another aspect of the disclosure, one of the amplification stages comprises a third amplification stage adapted to apply a current gain to the second current signal to generate a third current signal, apply the third current signal through a load to generate a third voltage signal related to the output signal, and apply a negative conductance across the load. In yet another aspect, the current gain is adjustable. In still another aspect, the amplification stages are respectively tuned to distinct frequency bands.

In another aspect of the disclosure, one of the amplification stages comprises a second amplification stage adapted to apply a current gain to the first current signal to generate a second current signal, apply the second current signal through a load to generate a second voltage signal related to the output signal, and apply a negative conductance across the load.

Other aspects, advantages and novel features of the present disclosure will become apparent from the following detailed description of the disclosure when considered in conjunction with the accompanying drawings.

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Figure 1A:
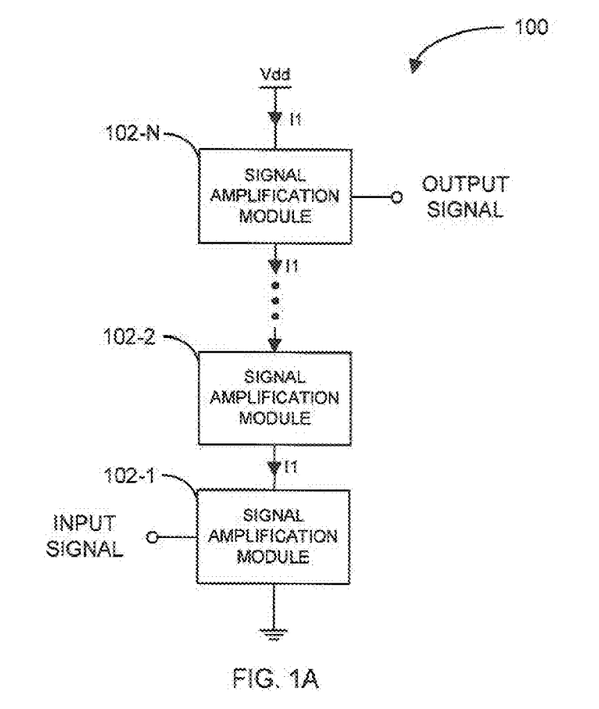
FIG. 1A illustrates a block diagram of an exemplary signal amplifier in accordance with an aspect of the disclosure.

FIG. 1A illustrates a block diagram of an exemplary signal amplifier 100 in accordance with an aspect of the disclosure. In summary, the amplifier 100 includes a plurality of cascaded amplification stages or modules adapted to amplify an input signal (e.g., a radio frequency (RF) signal) to generate an output signal. The amplification stages uses a common bias current to perform the amplification of the input signal. The amplifier 100 may be used in any signal amplification applications, such as in a low noise amplifier (LNA) application, power amplifier (PA) application, and others.

In this example, the amplifier 100 comprises a plurality of cascaded signal amplification modules 102-1 to 102-N connected between a positive power supply rail Vdd and a negative power supply rail, which could be at ground potential as shown, or a voltage more negative than Vdd. When activated, the power supply produces a DC current I1 to bias the plurality of signal amplification modules 102-1 to 102-N. In this example, an input signal is applied to the first amplification module 102-1, which performs a first stage amplification of the input signal. The amplified input signal may then be applied to the second amplification module 102-2, which performs a second stage amplification of the amplified input signal. The amplification of the signal may continue until the last amplification stage 102-N to generate the output signal. It shall be understood that N may be two or more. In summary, the amplifier 100 amplifies the input signal in a very power efficient manner because it uses a common DC current I1 to bias all of the amplification stages 102-1 to 102-N. Each of the stages 102-1 to 102-N may be tuned to a distinct frequency band so that the overall bandwidth of the amplifier 100 may be configured larger than each of the individual bandwidths of the respective stages.

Figure 1B:
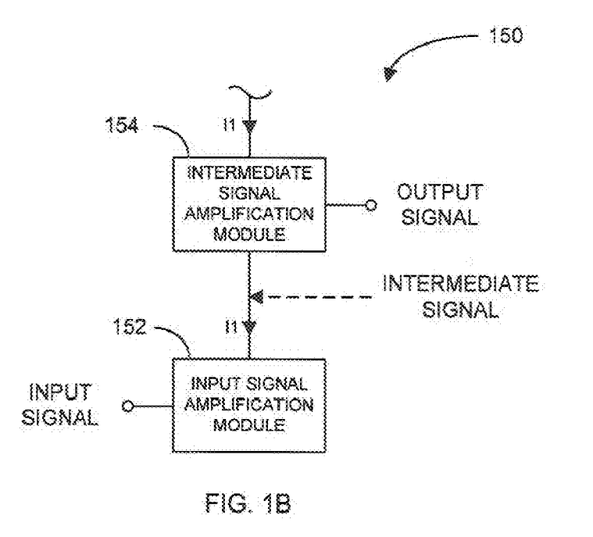
FIG. 1B illustrates a block diagram of another exemplary signal amplifier in accordance with an aspect of the disclosure.

FIG. 1B illustrates a block diagram of an exemplary signal amplifier 150 in accordance with an aspect of the disclosure. In summary, the amplifier 150 is configured to amplify an input signal to generate an output signal. In particular, the amplifier 150 comprises an input signal amplification module 152 adapted to amplify an input signal using a common bias current I1 to generate an intermediate signal. The amplifier 150 further comprises an intermediate signal amplification module 154 adapted to amplify the intermediate signal using the common bias current I1 to generate the output signal.

Figure 2:
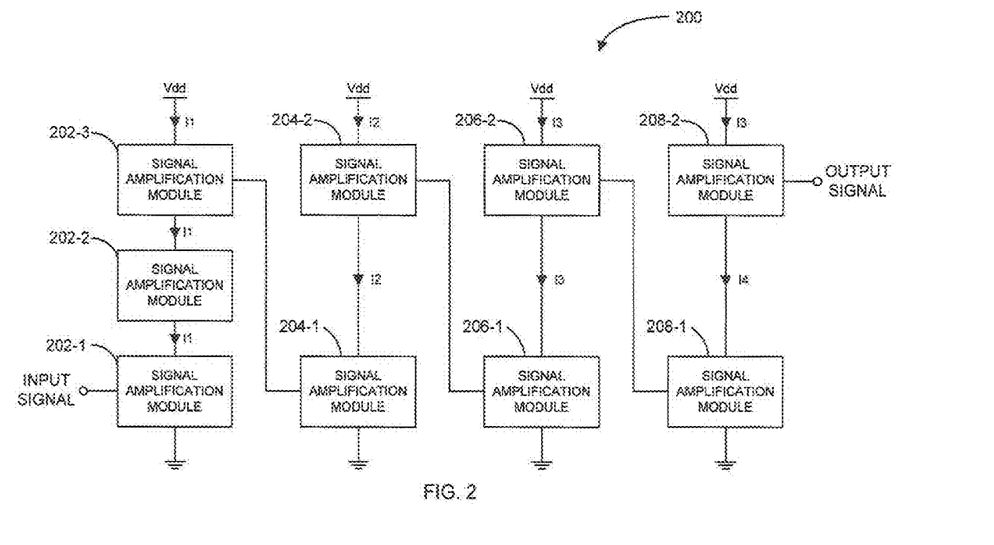
FIG. 2 illustrates a block diagram of another exemplary signal amplifier in accordance with another aspect of the disclosure.

FIG. 2 illustrates a block diagram of another exemplary signal amplifier 200 in accordance with another aspect of the disclosure. The above-mentioned concept of using a plurality of amplification stages biased by a common DC current may be extended to a plurality of series connected sets of cascaded amplification stages, wherein each set is biased by a common DC current, as exemplified in amplifier 200.

In particular, the amplifier 200 comprises a first set of amplification stages 202-1 to 202-3 connected between a positive power supply rail Vdd and a negative power supply rail (e.g., ground). In this example, the first set of amplification stages 202-1 to 202-3 comprises three (3) stages. As previously discussed, any of the sets of amplification stages may comprises two or more stages. When activated, the power supply produces a common DC current Il that biases the amplification stages 202-1 to 202-3 of the first set. An input signal (e.g., an input RF signal) is applied to the first amplification stage 202-1 of the first set. The input signal is then amplified by the three (3) stages 202-1 to 202-3 to generate a first intermediate signal.

The amplifier 200 further comprises a second set of amplification stages 204-1 to 204-2 connected between the positive power supply rail Vdd and the negative power supply rail (e.g., ground). In this example, the second set of amplification stages 204-1 to 204-2 comprises two (2) stages. When activated, the power supply produces a common DC current I2 that biases the amplification stages 204-1 to 204-2 of the second set. The first intermediate signal at the output of the signal amplification module 202-3 is applied to the first amplification module 204-1 of the second set. The first intermediate signal is then amplified by the two (2) stages 202-1 to 202-2 to generate a second intermediate signal.

The amplifier 200 may be configured with more sets of cascaded amplification stages, as illustrated herein, by a third set of amplification stages 206-1 to 206-2 which uses a common bias current I3, and a fourth set of amplification stages 208-1 to 208-2 which uses a common bias current I4. The third set of amplification stages 206-1 to 206-2 amplify the second intermediate signal at the output of signal amplification module 204-2 to generate a third intermediate signal. Similarly, the fourth set of amplification stages 208-1 to 208-2 amplify the third intermediate signal at the output of signal amplification module 206-2 to generate the output signal. As previously discussed, the bandwidths of the amplification modules of the amplifier 200 may be respectively selected to achieve a defined gain response across a defined frequency bandwidth.

Figure 3A:
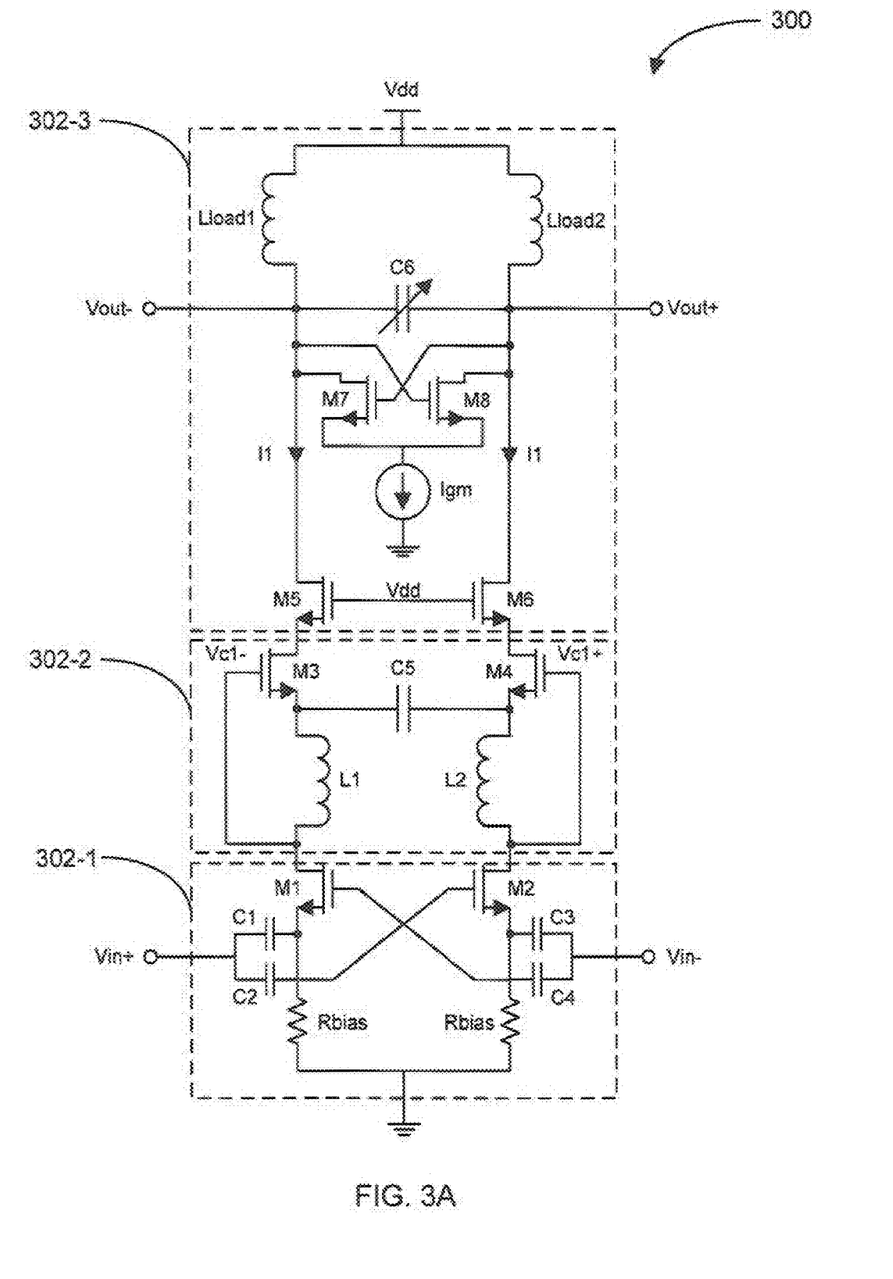
FIG. 3A illustrates a schematic diagram of an exemplary three (3) stage signal amplifier in accordance with another aspect of the disclosure.

FIG. 3A illustrates a schematic diagram of an exemplary three-stage signal amplifier 300 in accordance with another aspect of the disclosure. The three-stage signal amplifier 300 is an exemplary implementation of an amplifier that includes a plurality of amplification stages, in this case three (3), and that uses a common DC current 2×I1 for biasing the stages. Additionally, the amplification stages may be configured to each have a distinct frequency bandwidth to achieve a defined overall frequency bandwidth for the amplifier 300.

In particular, the amplifier 300 comprises three cascaded amplification stages including a first amplification stage 302-1, a second amplification stage 302-2, and a third amplification stage 302-3. The amplification stages 302-1 to 302-3 are situated between a positive power supply voltage terminal Vdd and a negative power supply voltage terminal, which may be at ground potential as shown. When activated, the power supply generates a DC current 2×I1 for biasing the amplification stages 302-1 to 302-3.

The first amplification stage 302-1 is configured to apply a transconductance gain to an input differential voltage signal (Vin+, Vin−) to generate a current signal through the active device. In this example, the first amplification stage 302-1 uses metal oxide semiconductor field effect transistors (MOSFETs) to apply the transconductance gain to the input differential voltage signal (Vin+, Vin−) to generate a current signal through the active devices. It shall be understood that the input voltage signal need not be a differential voltage, and that the active device need not be MOSFETs, but may encompasses other types of transistors. Additionally, as discussed in more detail below, the first amplification stage 302-1 includes a routing network to route the input differential voltage signal (Vin+, Vin−) in a manner that substantially doubles the voltage applied to the MOSFETs.

More specifically, the first amplification stage 302-1 comprises first and second MOSFETs M1 and M2, capacitors C1-C4, and bias resistors Rbias. The capacitor C1 is coupled between the positive input signal Vin+ port and the source of the MOSFET M1. The capacitor C2 is coupled between the positive input signal Vin+ port and the gate of MOSFET M2. The capacitor C3 is coupled between the negative input signal Vin− port and the source of MOSFET M2. The capacitor C4 is coupled between the negative input signal Vin− port and the gate of MOSFET M1. The bias resistors Rbias are coupled between the sources of MOSFETs M1 and M2 and the negative power supply voltage rail (e.g., ground), respectively. The bias resistors Rbias may be replaced with or coupled with an inductor, current source or some other type of bias structure. In this configuration, the first amplification stage 302-1 is configured as a common gate amplification stage with gain boosting.

In operation, the capacitors C1-C4 route the differential input voltage (Vin+, Vin−) in a manner that substantially doubles the effective voltage applied to the MOSFETs M1 and M2. More specifically, the input voltage to MOSFET M1 is its gate-to-source (Vgs1) voltage, which in this case, is substantially equal to Vin−−Vin+. The input voltage to MOSFET M2 is its gate-to-source (Vgs2) voltage, which in this case, is substantially equal to Vin+−Vin−. Thus, the effective input differential voltage signal $Vin_{eff}$ to the MOSFETs M1 and M2 may be given by the following:

$$Vin_{eff}=(Vin+-Vin-)-(Vin--Vin+)=2*(Vin+-Vin-) \qquad \text{Eq. 1}$$

As apparent from Eq. 1, the effective input differential voltage signal $Vin_{eff}$ to the MOSFETs M1 and M2 is substantially double the input differential voltage Vin+−Vin−. This has the effect of increasing the transconductance gain gm of the devices, or maintaining the same gain/transconductance with the bias current and power consumption being lower. Being biased by the common bias current 2×I1, the MOSFETs M2 and M1 apply a transconductance gain to the effective input differential voltage signal $Vin_{eff}$ to generate a first differential current signal through the MOSFETs M1 and M2. Furthermore, the first amplification stage 302-1 has the additional benefit of providing a broadband input impedance, which is particular suited for wideband applications, such as ultra wideband (UWB).

The second amplification stage 302-2 is configured to generate a second differential voltage signal (Vcl+, Vcl−) from the first differential current signal generated by the first amplification stage 302-1, and to apply a transconductance gain to the second differential voltage signal (Vcl+, Vcl−) to generate a second differential current signal. In this example, the second amplification stage 302-2 also uses MOSFETs to apply the transconductance gain. Additionally, as discussed in more detail below, the second amplification stage 302-2 employs a resonator to convert the first differential current signal into the second differential voltage signal (Vcl+, Vcl−).

More specifically, the second amplification stage 302-2 comprises MOSFETs M3 and M4, capacitor C5, and inductors L1 and L2. The capacitor C5 is coupled between the sources of the MOSFETs, and should be configured relatively large to substantially create an RF short between the sources of MOSFETs M3 and M4 at the frequency of interest. This configures the second amplification stage 302-2 as a common source amplification stage. The inductors L1 and L2 are coupled between the sources of MOSFETs M3 and M4 and the drains of MOSFETs M1 and M2 of the first amplification stage 302-1, respectively. The gates of the MOSFETs M3 and M4 are coupled to the drains of MOSFETs M1 and M2, respectively.

In operation, the inductors L1 and L2 form a resonator with the gate capacitance of the MOSFETs M3 and M4 and the drain capacitance of MOSFETs M1 and M2. The inductors L1 and L2 and the MOSFETs M1-M4 may be configured to set the resonant frequency of the resonator within a defined frequency range, approximate the center frequency of the overall bandwidth of the amplifier 300. The first differential current signal generated by the first amplification stage 302-1 flows through the resonator to form the second differential voltage signal (Vcl+, Vcl−) between the gates of the MOSFETs M3 and M4. Also, being biased by the common bias current 2×I1, the MOSFETs M3 and M4 apply a transconductance gain to the second differential voltage signal (Vcl+, Vcl−) to generate a second differential current signal through the MOSFETs M3 and M4.

The third amplification stage 302-3 is configured to apply a current gain to the second differential current signal generated by the second amplification stage 302-2 to generate a third differential current signal. The third amplification stage 302-3 further includes an inductive load through which the third differential current signal flows to generate an output differential voltage signal (Vout+, Vout−). Additionally, as discussed in more detail below, the third amplification stage 302-3 employs a negative conductance device coupled in parallel with the load in order to increase the impedance of the load so as to increase the output differential voltage signal (Vout+, Vout−).

More specifically, the third amplification stage 302-3 comprises MOSFETs M5 and M6, inductive loads Lload1 and Lload2, frequency-tuning capacitor C6, MOSFETs M7 and M8, and current source Igm. The sources of the MOSFETs M5 and M6 are coupled to the drains of MOSFETs M3 and M4, respectively. The gates of the MOSFET M5 and M6 are coupled to the positive power supply voltage rail Vdd. The inductive loads Lload1 and Lload2 are coupled between the positive power supply voltage rail Vdd and the drains of MOSFETs M5 and M6, respectively. The frequency-tuning capacitor C6 is coupled between the drains of MOSFETs M5 and M6. The drain of MOSFET M7 and gate of MOSFET M8 are coupled to the drain of MOSFET M5. Similarly, the gate of MOSFET M7 and drain of MOSFET M8 are coupled to the drain of MOSFET M6. The current source Igm is coupled between the sources of MOSFETs M7 and M8, and the negative power supply voltage rail (e.g., ground). The current source Igm could be replaced with a resistor or other type of bias structure.

In operation, the MOSFETs M5 and M6, being biased by the common bias current 2×I1, apply a current gain to the second differential current signal generated by the second amplification stage 302-2 to generate a third differential current signal. The third differential current signal flows through the inductive loads Lload1 and Lload2 to generate the output differential voltage signal (Vout+, Vout−). The MOSFETs M7 and M8 and the current source Igm operate as a negative conductance coupled in parallel with the inductive loads Lload1 and Lload2 to increase the impedance of the loads. The increase in the inductive load impedance produces a corresponding increase in the output differential voltage signal (Vout+, Vout−).

The amplifier 300 may be configured to provide a relatively wideband match and amplification of the input signal. For instance, the amplification stages 302-1 to 302-3 may be configured to have distinct frequency bandwidths to achieve a relatively wide overall bandwidth for the amplifier 300. For example, the frequency-selecting components of the first amplification stage 302-1, mainly the capacitance of capacitors C1, C2, C3 and C4, the size and bias of MOSFETs M1 and M2, and any external impedance matching components may be configured to set a defined bandwidth for the first stage 302-1. Similarly, the frequency-selecting components of the second amplification stage 302-2, mainly the inductance of inductors L1 and L2 and the size and bias of MOSFETs M3 and M4, may be configured to set a defined bandwidth for the second stage 302-2 that is different than that of the first stage 302-1. In a similar fashion, the frequency-selecting components of the third amplification stage 302-3, mainly the inductance of the inductive loads Lload1 and Lload2, the selected capacitance of C6, the size and bias of MOSFETs M5 to M7, and the output load of the amplifier 300 may be configured to set a defined bandwidth for the third stage 302-3 that is different than that of at least one of the first and second stages 302-1 and 302-2.

Figure 3B:
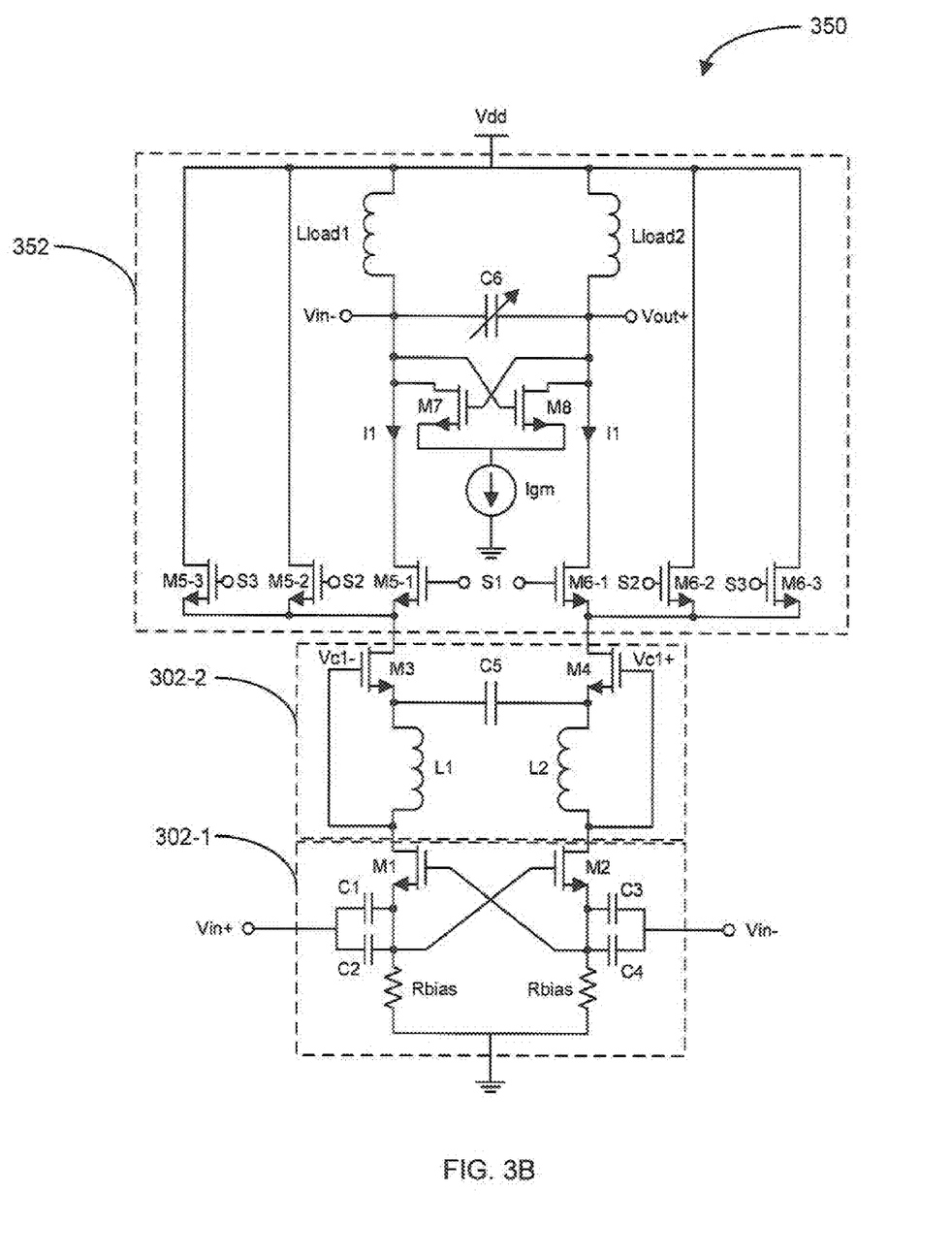
FIG. 3B illustrates a schematic diagram of another exemplary three (3) stage signal amplifier in accordance with another aspect of the disclosure.

FIG. 3B illustrates a schematic diagram of another exemplary three-stage signal amplifier 350 in accordance with another aspect of the disclosure. The amplifier 350 is similar to that of amplifier 300, except that the last stage is configured to provide an adjustable current gain in order to set or control the output power of the amplifier 350. In particular, the amplifier 350 comprises the first amplification stage 302-1 as previously discussed, the second amplification stage 302-2 as previously discussed, and a third amplification stage 352.

The third amplification stage 352 is similar to the third amplification stage 302-3, and similarly includes inductive loads Lload1 and Lload2, tuning capacitor C6, and the negative conductance including MOSFETs M7 and M8 and current source Igm. The third amplification stage 352 differs from amplification stage 302-3 in that the current gain MOSFETs M5 and M6 have been replaced with three-selectable current gain MOSFETs M5-1 to M5-3 and M6-1 to M6-3, respectively. Gain select signals S1-S3 are respectively applied to the gates of MOSFET pairs (M5-1, M6-1), (M5-2, M6-2), and (M5-3, M6-3) to selectively adjust the gain of the third amplification stage 352.

Figure 4:
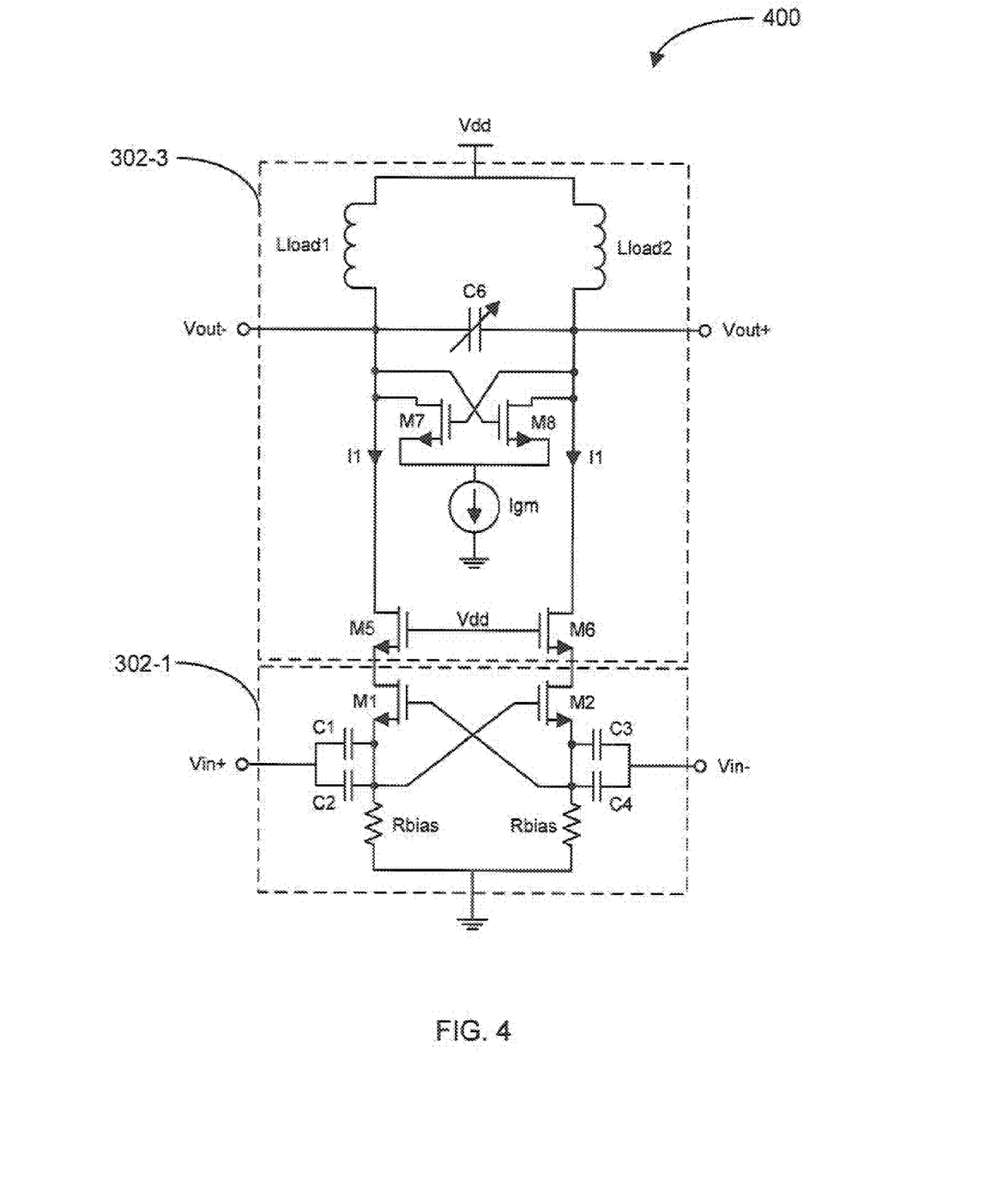
FIG. 4 illustrates a schematic diagram of an exemplary two (2) stage signal amplifier in accordance with another aspect of the disclosure.

FIG. 4 illustrates a schematic diagram of an exemplary two-stage signal amplifier 400 in accordance with another aspect of the disclosure. The amplifier 400 comprises the first and third amplification stages 302-1 and 302-3 of the amplifier 300. In operation, the first amplification stage 302-1 receives the input differential voltage signal (Vin+, Vin−), and using the capacitors C1-C4, effectively doubles the input differential voltage applied to the MOSFETs M1 and M2. The MOSFETs M1 and M2, being biased by the common DC current 2×I1, apply a transconductance gain to the effective input voltage signal to generate a first current signal. The MOSFETs M5 and M6, also being biased by the common DC current 2×I1, apply a current gain to the first current signal to generate a second current signal. The second current signal flows through the inductive loads Lload 1-2 to generate the output voltage signal (Vout+, Vout−). The negative conductance circuit increases the effective impedance of the loads so as to further increase the gain of the third amplification stage 352.

Figure 5:
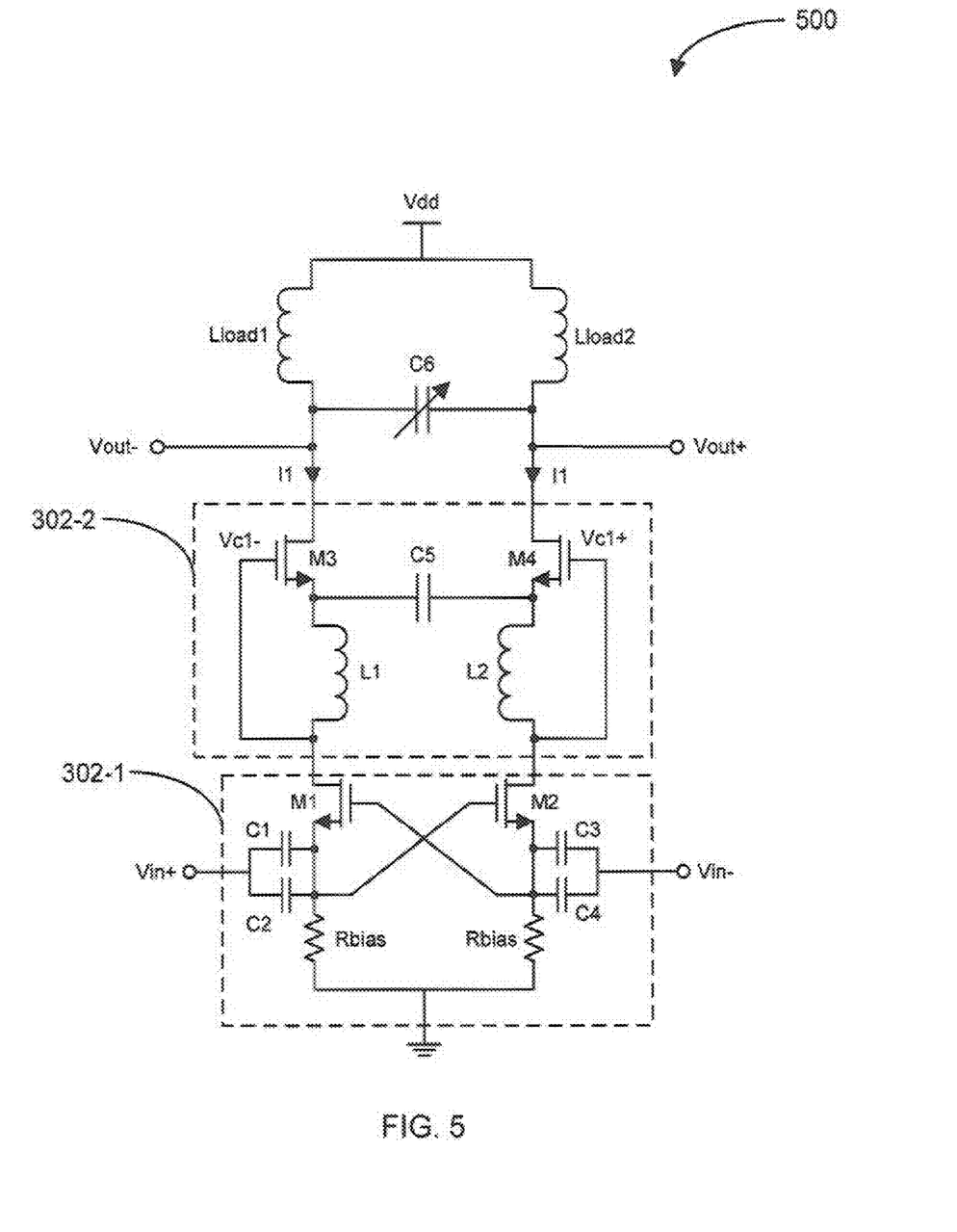
FIG. 5 illustrates a schematic diagram of another exemplary two (2) stage signal amplifier in accordance with another aspect of the disclosure.

FIG. 5 illustrates a schematic diagram of another exemplary two-stage signal amplifier 500 in accordance with another aspect of the disclosure. The amplifier 500 comprises the first and second amplification stages 302-1 and 302-2 and the inductive loads Lload1-2 of the amplifier 300. In operation, the first amplification stage 302-1 receives the differential voltage signal (Vin+, Vin−), and using the capacitors C1-C4, effectively doubles the input differential voltage as applied to the MOSFETs M1 and M2. The MOSFETs M1 and M2, being biased by the common DC current 2×I1, apply a transconductance gain to the effective input voltage signal to generate a first current signal. The first current signal flows through the resonator (e.g., the inductors L1-L2, gate capacitance of MOSFETs M3-M4, and drain capacitance of MOSFETs M5-M6) to generate an intermediate differential voltage signal (Vcl+, Vcl−) at the gates of MOSFETs M3 and M4. The MOSFETs M3 and M4 apply a transconductance gain to the intermediate differential voltage signal (Vcl+, Vcl−) to generate a second differential current signal. The second differential current signal flows through the inductive loads Lload 1-2 to generate the output differential voltage signal (Vout+, Vout−). The negative conductance circuit increases the effective impedance of the loads so as to further increase the gain of the amplifier 500.

Figure 6:
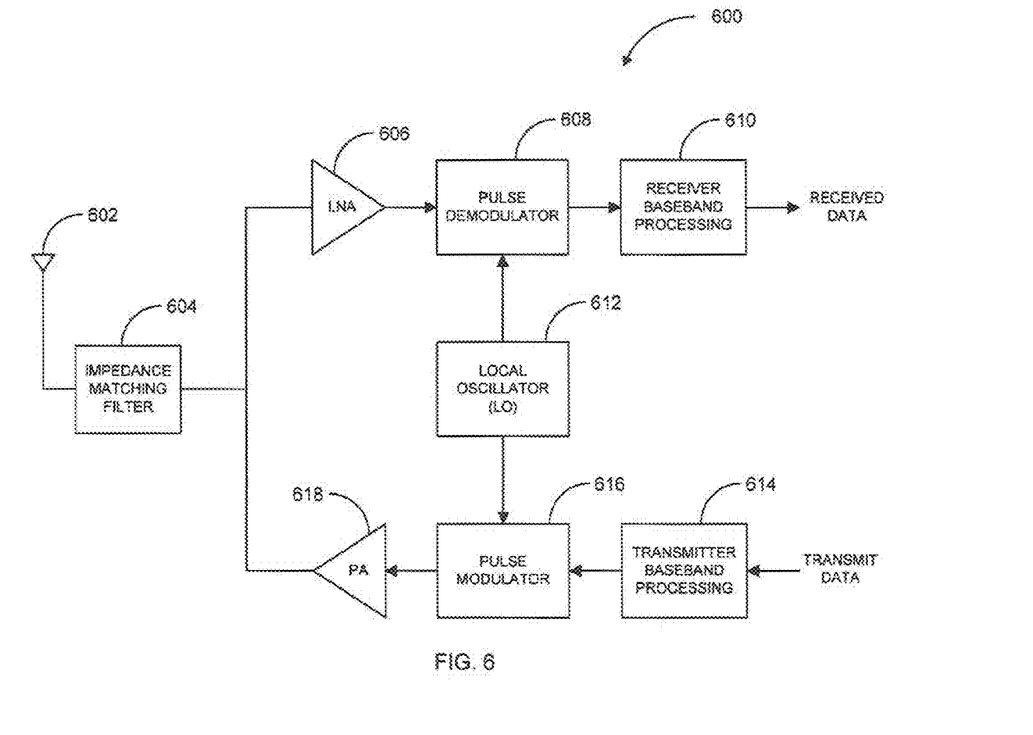
FIG. 6 illustrates a block diagram of an exemplary transceiver in accordance with another aspect of the disclosure.

FIG. 6 illustrates a block diagram of an exemplary communication device 600 in accordance with another aspect of the disclosure. The communication device 600 may be one exemplary implementation of a communication device that uses any of the apparatuses previously discussed as a low noise amplifier (LNA) and/or power amplifier (PA). In particular, the communication device 600 comprises an antenna 602, an impedance matching filter 604, a low noise amplifier (LNA) 606, a pulse demodulator 608, a receiver baseband processing module 610, a local oscillator (LO) 612, a transmitter baseband processing module 614, a pulse modulator 616, and a power amplifier (PA) 618. As previously discussed, the LNA 606 and/or the PA 618 may be configured as any of the apparatuses described above.

As a source communication device, data to be transmitted to a destination communication device is sent to the transmitter baseband processing module 614. The transmitter baseband processing module 614 processes the transmit data to generate an outgoing baseband signal. The pulse modulator 616, using a signal generated by the local oscillator (LO) 612, processes the outgoing baseband signal to generate an RF signal. The PA 618 amplifies the RF signal and provides it to the antenna 602 via the impedance matching filter 604 for transmission into a wireless medium. The transmit data may be generated by a sensor, a microprocessor, a microcontroller, a RISC processor, a keyboard, a pointing device such as a mouse or a track ball, an audio device, such as a headset, including a transducer such as a microphone, a medical device, a shoe, a robotic or mechanical device that generates data, a user interface, such as a touch-sensitive display, a user device, etc.

As a destination communication device, an RF signal carrying data is picked up by the antenna 602 and applied to the LNA 606 via the impedance matching filter 604. The LNA 606 amplifies the received RF signal. The pulse demodulator 608, using a signal generated by the local oscillator (LO) 612, processes the received RF signal to generate a received baseband signal. The receiver baseband processing 610 processes the received baseband signal to produce the received data. A data processor (not shown) may then perform one or more defined operations based on the received data. For example, the data processor may include a microprocessor, a microcontroller, a reduced instruction set computer (RISC) processor, a display, an audio device, such as a headset, including a transducer such as speakers, a medical device, a shoe, a watch, a robotic or mechanical device responsive to the data, a user interface, such as a display, one or more light emitting diodes (LED), a user device, etc. a user device etc. As an example, a user device may be a watch worn to display at least one of the following indications: (1) how fast you're running based on its communication with a sensor in one's shoes; (2) how far you have run; or (3) one's heart rate based on its communication with a sensor attached to one's body. Alternatively, instead of a watch, the user device may be mounted on a bicycle to display such indications.

Figure 7:
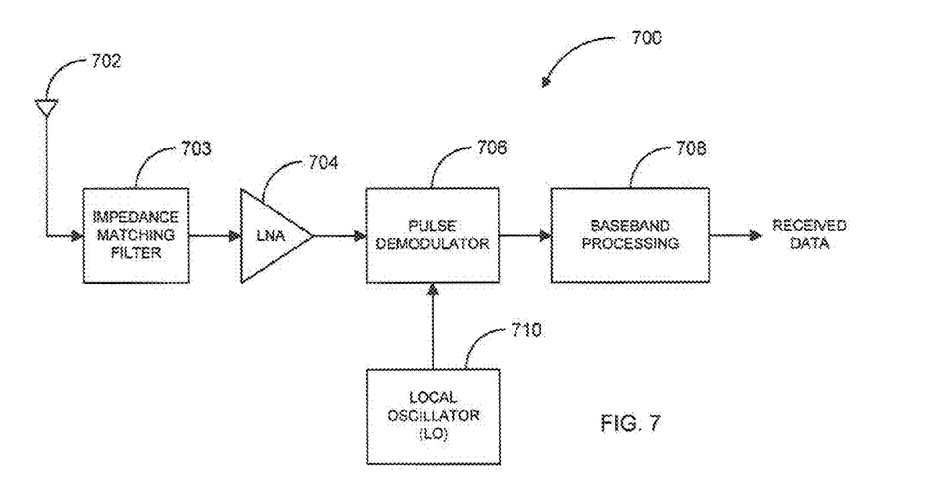
FIG. 7 illustrates a block diagram of an exemplary receiver in accordance with another aspect of the disclosure.

FIG. 7 illustrates a block diagram of an exemplary communication device 700 in accordance with another aspect of the disclosure. The communication device 700 may be one exemplary implementation of a communication device that uses any of the apparatuses previously discussed as a low noise amplifier (LNA). In particular, the communication device 700 comprises an antenna 702, an impedance matching filter 703, a low noise amplifier (LNA) 704, a pulse demodulator 706, a baseband processing module 708, and a local oscillator (LO) 710. As previously discussed, the LNA 704 may be configured as any of the amplifiers described above.

In operation, an RF signal carrying data is picked up by the antenna 702 and applied to the LNA 704 via the impedance matching filter 703. The LNA 704 amplifies the received RF signal. The pulse demodulator 706, using a signal generated by the local oscillator (LO) 710, processes the received RF signal to generate a baseband signal. The processing module 708 processes the baseband signal to produce the received data. A data processor (not shown) may then perform one or more defined operations based on the received data. For example, the data processor may include a microprocessor, a microcontroller, a reduced instruction set computer (RISC) processor, a display, an audio device, such as a headset, including a transducer such as speakers, a medical device, a shoe, a watch, a robotic or mechanical device responsive to the data, a user interface, such as a display, one or more light emitting diodes (LED), user device, a user device, etc.

Figure 8:
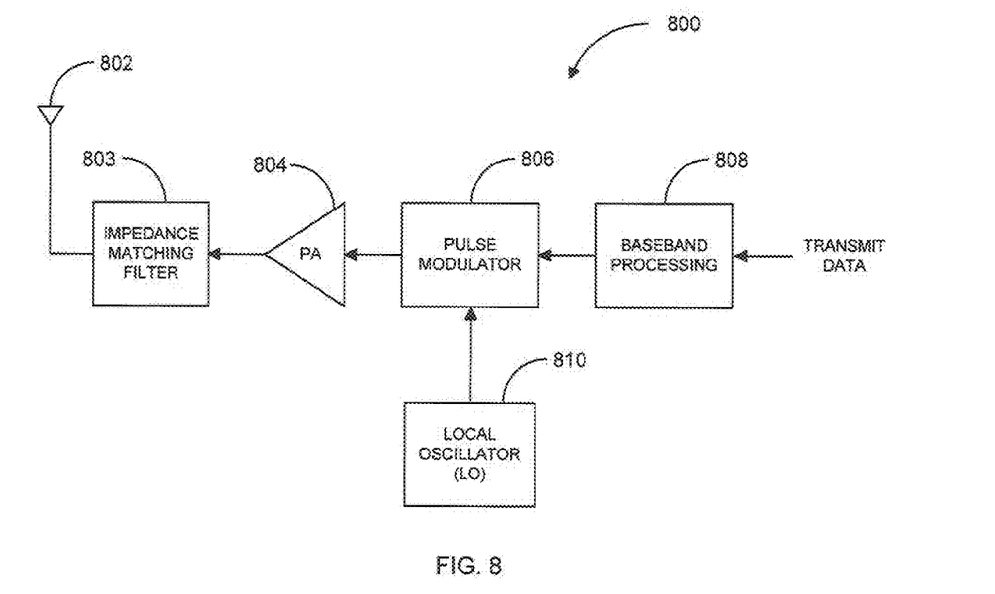
FIG. 8 illustrates a block diagram of an exemplary transmitter in accordance with another aspect of the disclosure.

FIG. 8 illustrates a block diagram of an exemplary communication device 800 in accordance with another aspect of the disclosure. The communication device 800 may be one exemplary implementation of a communication device that uses any of the apparatuses previously discussed as a power amplifier (PA). In particular, the communication device 800 comprises an antenna 802, an impedance matching filter 803, a power amplifier (PA) 804, a pulse modulator 806, a local oscillator (LO), and a baseband processing module 808. As previously discussed, the PA 804 may be configured as any of the apparatuses described above.

In operation, data to be transmitted to a destination communication device is sent to the baseband processing module 808. The baseband processing module 808 processes the transmit data to generate a baseband signal. The pulse modulator 806, using a signal generated by the local oscillator (LO) 810, processes the baseband signal to generate an RF signal. The PA 804 amplifies the RF signal and provides it to the antenna 802 via the impedance matching filter 803 for transmission into a wireless medium. The transmit data may be generated by a sensor, a microprocessor, a microcontroller, a RISC processor, a keyboard, a pointing device such as a mouse or a track ball, an audio device, such as a headset, including a transducer such as a microphone, a medical device, a shoe, a robotic or mechanical device that generates data, a user interface, such as a touch-sensitive display, etc.

Figure 9A:
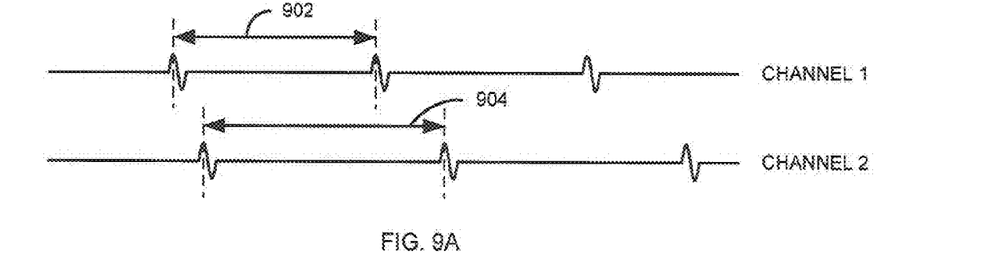
FIGS. 9A-D illustrate timing diagrams of various pulse modulation techniques in accordance with another aspect of the disclosure.

FIG. 9A illustrates different channels (channels 1 and 2) defined with different pulse repetition frequencies (PRF) as an example of a pulse modulation that may be employed in any of the communications systems, devices, and apparatuses described herein. Specifically, pulses for channel 1 have a pulse repetition frequency (PRF) corresponding to a pulse-to-pulse delay period 902. Conversely, pulses for channel 2 have a pulse repetition frequency (PRF) corresponding to a pulse-to-pulse delay period 904. This technique may thus be used to define pseudo-orthogonal channels with a relatively low likelihood of pulse collisions between the two channels. In particular, a low likelihood of pulse collisions may be achieved through the use of a low duty cycle for the pulses. For example, through appropriate selection of the pulse repetition frequencies (PRF), substantially all pulses for a given channel may be transmitted at different times than pulses for any other channel.

The pulse repetition frequency (PRF) defined for a given channel may depend on the data rate or rates supported by that channel. For example, a channel supporting very low data rates (e.g., on the order of a few kilobits per second or Kbps) may employ a corresponding low pulse repetition frequency (PRF)). Conversely, a channel supporting relatively high data rates (e.g., on the order of a several megabits per second or Mbps) may employ a correspondingly higher pulse repetition frequency (PRF).

Figure 9B:
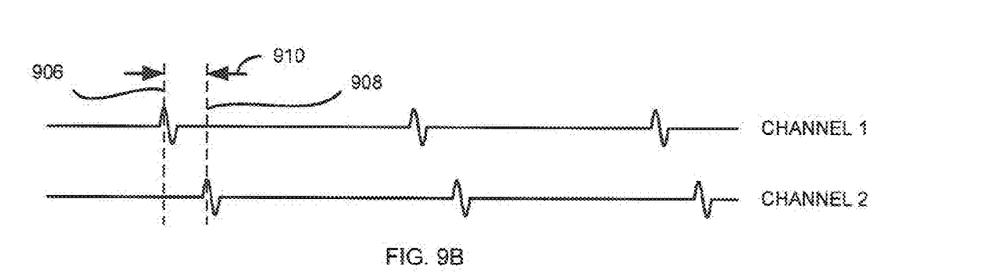

FIG. 9B illustrates different channels (channels 1 and 2) defined with different pulse positions or offsets as an example of a modulation that may be employed in any of the communications systems described herein. Pulses for channel 1 are generated at a point in time as represented by line 906 in accordance with a first pulse offset (e.g., with respect to a given point in time, not shown). Conversely, pulses for channel 2 are generated at a point in time as represented by line 908 in accordance with a second pulse offset. Given the pulse offset difference between the pulses (as represented by the arrows 910), this technique may be used to reduce the likelihood of pulse collisions between the two channels. Depending on any other signaling parameters that are defined for the channels (e.g., as discussed herein) and the precision of the timing between the devices (e.g., relative clock drift), the use of different pulse offsets may be used to provide orthogonal or pseudo-orthogonal channels.

Figure 9C:
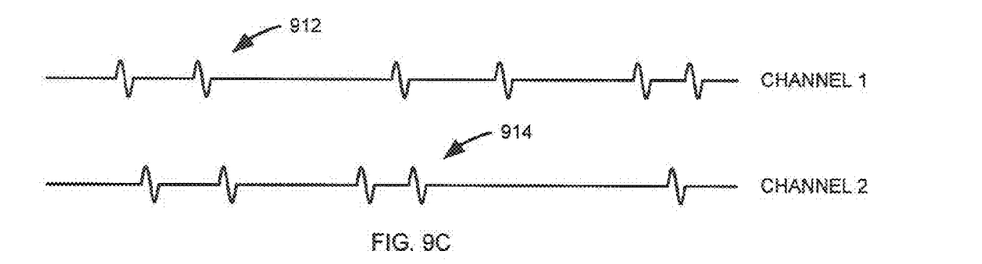

FIG. 9C illustrates different channels (channels 1 and 2) defined with different timing hopping sequences modulation that may be employed in any of the communications systems described herein. For example, pulses 912 for channel 1 may be generated at times in accordance with one time hopping sequence while pulses 914 for channel 2 may be generated at times in accordance with another time hopping sequence. Depending on the specific sequences used and the precision of the timing between the devices, this technique may be used to provide orthogonal or pseudo-orthogonal channels. For example, the time hopped pulse positions may not be periodic to reduce the possibility of repeat pulse collisions from neighboring channels.

Figure 9D:
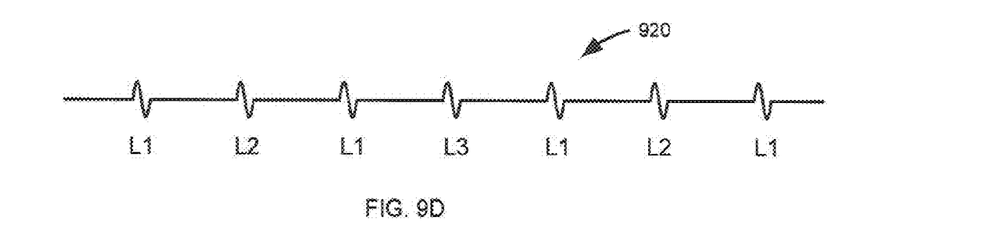

FIG. 9D illustrates different channels defined with different time slots as an example of a pulse modulation that may be employed in any of the communications systems described herein. Pulses for channel L1 are generated at particular time instances. Similarly, pulses for channel L2 are generated at other time instances. In the same manner, pulse for channel L3 are generated at still other time instances. Generally, the time instances pertaining to the different channels do not coincide or may be orthogonal to reduce or eliminate interference between the various channels.

It should be appreciated that other techniques may be used to define channels in accordance with a pulse modulation schemes. For example, a channel may be defined based on different spreading pseudo-random number sequences, or some other suitable parameter or parameters. Moreover, a channel may be defined based on a combination of two or more parameters.

Figure 10:
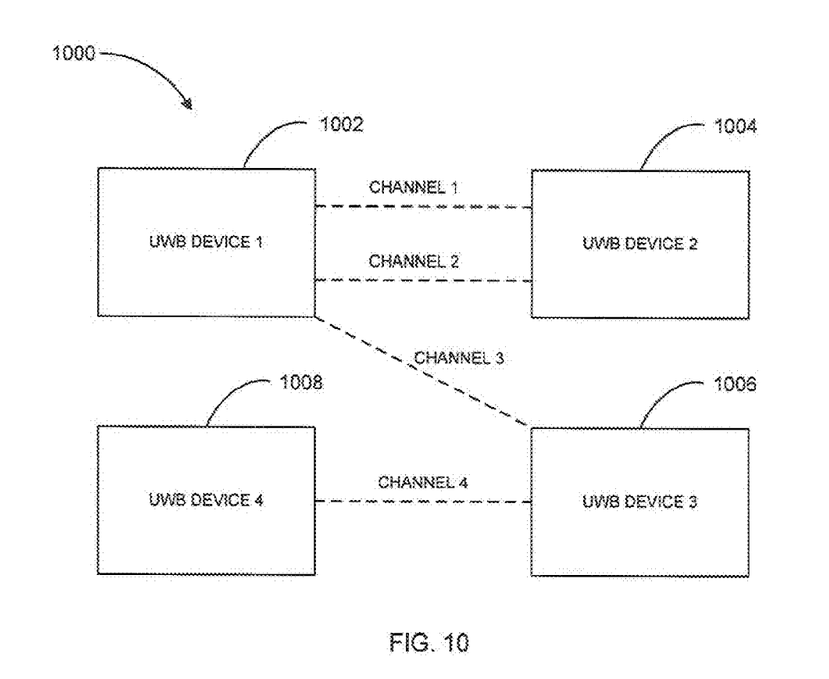
FIG. 10 illustrates a block diagram of various communications devices communicating with each other via various channels in accordance with another aspect of the disclosure.

FIG. 10 illustrates a block diagram of various ultra-wide band (UWB) communications devices communicating with each other via various channels in accordance with another aspect of the disclosure. For example, UWB device 1 1002 is communicating with UWB device 2 1004 via two concurrent UWB channels 1 and 2. UWB device 1002 is communicating with UWB device 3 1006 via a single channel 3. And, UWB device 3 1006 is, in turn, communicating with UWB device 4

1008 via a single channel 4. Other configurations are possible. The communications devices may be used for many different applications, and may be implemented, for example, in a headset, microphone, biometric sensor, heart rate monitor, pedometer, EKG device, watch, shoe, remote control, switch, tire pressure monitor, or other communications devices. A medical device may include smart band-aid, sensors, vital sign monitors, and others. The communications devices described herein may be used in any type of sensing application, such as for sensing automotive, athletic, and physiological (medical) responses.

Any of the above aspects of the disclosure may be implemented in many different devices. For example, in addition to medical applications as discussed above, the aspects of the disclosure may be applied to health and fitness applications. Additionally, the aspects of the disclosure may be implemented in shoes for different types of applications. There are other multitude of applications that may incorporate any aspect of the disclosure as described herein.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

While the invention has been described in connection with various aspects, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An apparatus, comprising a plurality of amplification stages adapted to use a common bias current to amplify an input signal so as to generate an output signal; wherein the amplification stages comprise:

a first amplification stage adapted to apply a first transconductance gain to a first voltage signal related to the input signal to generate a first current signal, wherein the first amplification stage comprises a routing network adapted to route the input signal so that the first voltage signal is substantially double the input signal; and a second amplification stage adapted to:
convert the first current signal into a second voltage signal; and
apply a second transconductance gain to the second voltage signal to generate a second current signal.

2. The apparatus of claim 1, wherein the first amplification stage comprises a common gate amplification stage.

3. The apparatus of claim 1, wherein the second amplification stage comprises a resonator adapted to convert the first current signal into the second voltage signal.

4. The apparatus of claim 1, wherein the second amplification stage comprises a common source amplification stage.

5. The apparatus of claim 1, wherein the amplification stages comprises a third amplification stage adapted to:
apply a current gain to the second current signal to generate a third current signal;
apply the third current signal through a load to generate a third voltage signal related to the output signal; and
apply a negative conductance across the load.

6. The apparatus of claim 5, wherein the current gain is adjustable.

7. An apparatus, comprising a plurality of amplification stages adapted to use a common bias current to amplify an input signal so as to generate an output signal, wherein the amplification stages comprise:
a first amplification stage adapted to apply a first transconductance gain to a first voltage signal related to the input signal to generate a first current signal, wherein the first amplification stage comprises a routing network adapted to route the input signal so that the first voltage signal is substantially double the input signal; and
a second amplification stage adapted to:
apply a current gain to the first current signal to generate a second current signal;
apply the second current signal through a load to generate a second voltage signal related to the output signal; and
apply a negative conductance across the load.

8. The apparatus of claim 1, wherein the amplification stages are respectively tuned to different frequency bands relative to one another.

9. A method of amplifying an input signal to generate an output signal comprising amplifying the input signal in multiple stages using a common bias current to generate the output signal; wherein amplifying the input signal in multiple stages comprises:
applying a first transconductance gain to a first voltage signal related to the input signal to generate a first current signal;
routing the input signal so that the first voltage signal is substantially double the input signal;
converting the first current signal into a second voltage signal; and
applying a second transconductance gain to the second voltage signal to generate a second current signal.

10. The method of claim 9, wherein applying the first transconductance gain comprises applying the first voltage signal to a common gate amplification stage.

11. The method of claim 9, wherein converting the first current signal into the second voltage signal comprises applying the first current signal through a resonator.

12. The method of claim 9, wherein applying the second transconductance gain to the second voltage signal comprises applying the second voltage signal to a common source amplification stage.

13. The method of claim 9, wherein amplifying the input signal in multiple stages further comprises:
applying a current gain to the second current signal to generate a third current signal;
applying the third current signal through a load to generate a third voltage signal related to the output signal; and
applying a negative conductance across the load.

14. The method of claim 13, further comprising adjusting the current gain.

15. A method of amplifying an input signal to generate an output signal, comprising amplifying the input signal in multiple stages using a common bias current to generate the output signal, wherein amplifying the input signal in multiple stages further comprises:
applying a first transconductance gain to a first voltage signal related to the input signal to generate a first current signal;
routing the input signal so that the first voltage signal is substantially double the input signal;
applying a current gain to the first current signal to generate a second current signal;
applying the second current signal through a load to generate a second voltage signal related to the output signal; and
applying a negative conductance across the load.

16. The method of claim 9, wherein amplifying the input signal in multiple stages comprises amplifying the input signal with the multiple stages tuned to different frequency bands relative to one another.

17. An apparatus for amplifying an input signal to generate an output signal comprising:
means for amplifying the input signal using a common bias current to generate an intermediate signal, wherein the means for amplifying the input signal comprises means for applying a first transconductance gain to a first voltage signal related to the input signal to generate a first current signal;
means for amplifying the intermediate signal using the common bias current to generate the output signal, wherein the means for amplifying the intermediate signal comprises:
means for converting the first current signal into a second voltage signal; and
means for applying a second transconductance gain to the second voltage signal to generate a second current signal;
means for routing the input signal so that the first voltage signal is substantially double the input signal.

18. The apparatus of claim 17, wherein the means for applying the first transconductance gain comprises means for applying the first voltage signal to a common gate amplification stage.

19. The apparatus of claim 17, wherein the means for converting the first current signal into the second voltage signal comprises means for applying the first current signal through a resonator.

20. The apparatus of claim 17, wherein the means for applying the second transconductance gain to the second voltage signal comprises means for applying the second voltage signal to a common source amplification stage.

21. The apparatus of claim 17, wherein the means for amplifying the intermediate signal further comprises:

means for applying a current gain to the second current signal to generate a third current signal;

means for applying the third current signal through a load to generate a third voltage signal related to the output signal; and means for applying a negative conductance across the load.

22. The apparatus of claim 21, further comprising means for adjusting the current gain.

23. An apparatus for amplifying an input signal to generate an output signal, comprising:

means for amplifying the input signal using a common bias current to generate an intermediate signal, wherein the means for amplifying the input signal comprises means for applying a first transconductance gain to a first voltage signal related to the input signal to generate a first current signal;

means for amplifying the intermediate signal using the common bias current to generate the output signal, wherein the means for amplifying the intermediate signal comprises:

means for applying a current gain to the first current signal to generate a second current signal;

means for applying the second current signal through a load to generate a second voltage signal related to the output signal; and means for applying a negative conductance across the load; and means for routing the input signal so that the first voltage signal is substantially double the input signal.

24. The apparatus of claim 17, wherein the means for amplifying the input signal and the means for amplifying the intermediate signal are tuned to different frequency bands relative to one another.

25. A computer program product for amplifying an input signal to generate an output signal, comprising:

a computer readable medium comprising instructions executable to:

amplify the input signal in multiple stages using a common bias current to generate the output signal, wherein amplifying the input signal in multiple stages comprises applying a first transconductance gain to a first voltage signal related to the input signal to generate a first current signal;

route the input signal so that the first voltage signal is substantially double the input signal;

convert the first current signal into a second voltage signal; and apply a second transconductance gain to the second voltage signal to generate a second current signal.

26. A headset, comprising:

a transducer adapted to generate audio data; and a transmitter adapted to transmit the audio data, wherein the transmitter comprises a plurality of amplification stages adapted to use a common bias current to amplify an input signal so as to generate an output signal comprising the audio data, wherein the amplification stages comprise:

a first amplification stage adapted to apply a first transconductance gain to a first voltage signal related to the input signal to generate a first current signal, wherein the first amplification stage comprises a routing network adapted to route the input signal so that the first voltage signal is substantially double the input signal; and a second amplification stage adapted to:

convert the first current signal into a second voltage signal; and apply a second transconductance gain to the second voltage signal to generate a second current signal.

27. A user device, comprising:

a receiver adapted to receive data, wherein the receiver comprises a plurality of amplification stages adapted to use a common bias current to amplify an input signal so as to generate an output signal comprising the received data, wherein the amplification stages comprise:

a first amplification stage adapted to apply a first transconductance gain to a first voltage signal related to the input signal to generate a first current signal, wherein the first amplification stage comprises a routing network adapted to route the input signal so that the first voltage signal is substantially double the input signal; and a second amplification stage adapted to:

convert the first current signal into a second voltage signal; and apply a second transconductance gain to the second voltage signal to generate a second current signal; and an interface adapted to display an indication based on the received data.

28. A sensing device, comprising:

a sensor adapted to generate sensed data; and a transmitter adapted to transmit an output signal, wherein the transmitter comprises a plurality of amplification stages adapted to use a common bias current to amplify an input signal so as to generate the output signal comprising the sensed data, wherein the amplification stages comprise:

a first amplification stage adapted to apply a first transconductance gain to a first voltage signal related to the input signal to generate a first current signal, wherein the first amplification stage comprises a routing network adapted to route the input signal so that the first voltage signal is substantially double the input signal; and a second amplification stage adapted to:

convert the first current signal into a second voltage signal; and apply a second transconductance gain to the second voltage signal to generate a second current signal.

* * * * *